United States Patent

Saito et al.

[11] Patent Number: 5,808,878
[45] Date of Patent: Sep. 15, 1998

[54] CIRCUIT SUBSTRATE SHIELDING DEVICE

[75] Inventors: Yasuhito Saito, Yokohama; Youko Maekawa, Fujisawa; Shimpei Yoshioka, Yokohama, all of Japan

[73] Assignee: Kabushiki Kaisha Toshiba, Kawasaki, Japan

[21] Appl. No.: 607,875

[22] Filed: Feb. 29, 1996

[30] Foreign Application Priority Data

Mar. 16, 1995 [JP] Japan ..................................... 7-057029
Mar. 16, 1995 [JP] Japan ..................................... 7-057030

[51] Int. Cl.[6] ..................................................... H05K 9/00
[52] U.S. Cl. .......................... 361/818; 361/748; 361/761; 257/659; 257/777
[58] Field of Search ..................................... 361/752, 748, 361/816, 818, 761, 764; 174/35 R, 52.2, 52.4; 257/659, 660, 678, 777

[56] References Cited

U.S. PATENT DOCUMENTS

| 4,717,990 | 1/1988 | Tugcu ....................................... 361/816 |
| 5,294,826 | 3/1994 | Marcantonio et al. ................... 257/659 |
| 5,557,508 | 9/1996 | Sato et al. ................................ 361/818 |

FOREIGN PATENT DOCUMENTS

| 3-032045 | 2/1991 | Japan .............................. H01L 23/28 |
| 5-67893 | 3/1993 | Japan ....................................... 361/818 |
| 5-29175 | 4/1993 | Japan . |
| 5-53269 | 7/1993 | Japan . |
| 5-275609 | 10/1993 | Japan .............................. H01L 25/00 |
| 5-347491 | 12/1993 | Japan ....................................... 361/818 |

OTHER PUBLICATIONS

"High–Performance Processor", IBM Technical Disclosure Bulletin, vol. 31, No. 10, Mar. 1989, pp. 229–231.

"Double Layer Recessed Hybrid Flip Chip on Board", Motorola Technical Developments, vol. 11, Oct. 1990, pp. 158–159.

EPO Search Report, Mar. 19, 1997.

*Primary Examiner*—Leo P. Picard
*Assistant Examiner*—Jayprakash N. Gandhi
*Attorney, Agent, or Firm*—Finnegan, Henderson, Farabow, Garrett & Dunner, L.L.P.

[57] ABSTRACT

A circuit substrate which is formed by fixing a wiring pattern on an insulated substrate has a shielding member for absorbing or reflecting radio waves formed on a first electronic component electrically connected. A shielding layer for absorbing or reflecting radio waves is formed on the circuit substrate. And, a second electronic component is disposed between the first electronic component and the shielding layer.

44 Claims, 4 Drawing Sheets

CIRCUIT SUBSTRATE SHIELDING DEVICE

BACKGROUND OF THE INVENTION

1. Field of the Invention

This invention relates to a circuit substrate shielding device, and particularly to a shielding device for a circuit substrate used for a high frequency.

2. Description of the Related Art

With the progress of the highly computerized society in these years, mobile communication equipment such as portable phones have become widespread rapidly, and data communications and image communications have developed as well. These communications are expected to be made at a higher speed, given advanced functions, and effected at a higher frequency. Besides, such equipment are considered to be further miniaturized rapidly.

For circuits which are particularly used for communication equipment for a high speed and a high frequency, components have to be not only packaged on a circuit substrate but also fully protected against noises. Noises are roughly divided into a radiation noise and a conduction noise, and they are dealt with separately. The conduction noise, if its conducting route is found, can be relatively easily dealt with by means of a noise filter or the like. But, the radiation noise is rather difficult to find its generation source. Therefore, the entire circuit substrate is generally housed into a shielding case made of metal. This method disturbs small electronic equipment such as portable phones from being made smaller in size and lighter in weight. Under the circumstances, various types of simplified shielding device have been proposed.

Description will be made of a typical circuit substrate shielding device for conventional small electronic equipment with reference to FIG. 11. A circuit pattern 2 made of copper or the like by etching is fixed onto an insulating substrate 1 made of alumina, glass epoxy or the like, and electronic components 3 such as chips and semiconductors are soldered to the component affixing areas of the circuit pattern 2 by a reflow soldering method to form a circuit substrate 4. For the circuit substrate 4 which has a surface where the electronic components 3 are not soldered or the circuit substrate 4 whose both surfaces have the electronic components 3 soldered, a wiring pattern 5 having reference potentials such as a ground and a power source is formed substantially on that entire surface or the inside layer surface of the circuit substrate 4, thereby shielding one side of the circuit substrate 4.

Furthermore, to cover completely a single circuit block containing the soldered electronic components 3, a metallic cap 6 made of a plate of aluminum or silicon steel is soldered to a connecting land 7 designed for the metallic cap 6 in order to cover the reference potentials such as a ground and a power source on the surface of the circuit substrate 4, thereby wholly shielding the circuit substrate 4. When a single circuit substrate 4 has a plurality of circuit blocks, each circuit block is covered with the metallic cap 6 to prevent the circuit blocks from interfering one another.

Thus, a sufficient shielding effect can be attained by the above structure. But, when compared with the aforementioned method which completely houses the circuit substrate 4 within the metallic shielding case, miniaturization and weight reduction can be made but the use of the metallic cap 6 restricts such measures.

There is also another method which effects the shielding without using the metallic cap 6 at all as shown in FIG. 12. Description will be made with reference to an example of the single-face packaged structure. First, the insulating substrate 1 is used which is made in the same way as shown in FIG. 11 that the wiring pattern 5 having the reference potentials is formed substantially on the entire area of one surface, and connecting lands 3a for connecting the electronic component 3 and the wiring pattern 2 are formed on the other surface. Besides, on almost the entire surface for connecting the electronic components 3 of the circuit substrate 4 excepting the area on which the electronic components 3 are soldered, an insulating layer 8 such as epoxy or polyimide is formed by screen printing or bonding. Then, a conductive paste of copper or the like is printed or cured onto almost the entire surface of the insulating layer 8 so as to be electrically connected to a wiring pattern 9 having the reference potentials, thereby forming a reference potential layer. Lastly, the electronic component 3 is soldered to produce a shield-structured circuit substrate.

Since the above structure does not use a metallic case or a metallic cap, miniaturization and weight reduction can be made, but a sufficient shielding effect cannot be attained because the electronic component and electronic component connected sections are exposed.

SUMMARY OF THE INVENTION

The invention has an object of providing a circuit substrate shielding device excelling in shielding effect without using any metallic cap.

To accomplish the above object, the circuit substrate shielding device of the invention comprises a circuit substrate, a first electronic component electrically connected to the circuit substrate and having a shielding member for absorbing or reflecting radio waves, a shielding layer formed on or in the vicinity of the circuit substrate to absorb or reflect radio waves, and a second electronic component disposed between the first electronic component and the shielding layer which is formed on or in the vicinity of the circuit substrate.

When the first electronic component is a semiconductor chip for example, the first and second electronic components are held between a reference potential layer formed on the circuit substrate and the semiconductor chip made of a conductive material of the first electronic component, so that the first and second electronic components can be shielded without using a metallic case or a metallic cap.

And, the circuit substrate shielding device of the invention also comprises a circuit substrate having a circuit pattern fixed to an insulating substrate, a first electronic component electrically connected to the circuit substrate and having a shielding material for absorbing or reflecting radio waves, and a second electronic component which is electrically connected to a surface of the circuit substrate opposed to the surface on the other side of the circuit substrate to which the first electronic component is connected and which has a shielding member for absorbing or reflecting radio waves.

With the above structures, since the first and second electronic components serve to shield, the shielding effect is remarkable without using a metallic cap, and a small and lightweight circuit substrate shielding structure can be made.

DESCRIPTION OF THE PREFERRED EMBODIMENTS

Now, the invention will be described in detail with reference to the accompanying drawings.

Figure 1:
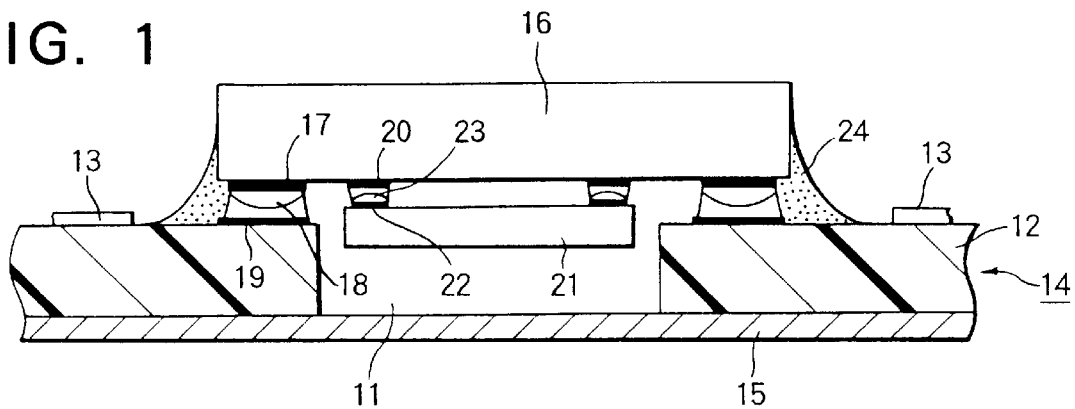
FIG. 1 is a cross section showing the first embodiment of the invention.

FIG. 1 is a structural view for showing the first embodiment of the invention. In FIG. 1, a circuit substrate 14 is configured by forming a wiring pattern 13 made of copper or the like by etching on insulating substrate 12 such as alumina or glass epoxy having an opening 11. Here, one surface of the circuit substrate 14 is almost entirely patterned including the opening 11, and electrically connected to a circuit reference potential pattern including a ground and a power source to form a reference potential layer 15.

Then, connecting pads 17 of an electronic component 16 such as a semiconductor chip are connected to connecting lands 19, which are electrically connected to the wiring pattern 13 of the circuit substrate 14, via a bump 18. On the electronic component 16, connecting lands 20 connected to the connecting pads 17 are previously formed on the surface inside the connecting pad 17, and connecting pads 22 of an electronic component 21 which is smaller than the electronic component 16 are connected to the connecting lands 20 via a bump 23. When the electronic component 16 is connected to the connecting lands 19, the electronic component 21 is positioned within the opening 11. The electronic component 21 is electrically connected to the wiring pattern 13 via the electronic component 16.

As the electronic component 16, a semiconductor chip has been exemplified here. But, as the semiconductor substrate for forming a device, a conductive substrate such as silicon is used or a non-conductive substrate such as gallium arsenide is used with its back surface coated with metal such as gold. And, the connected sections and periphery of the electronic component 16 are sealed with a resin 24 such as epoxy.

As described above, when the electronic component 16 is a semiconductor chip, the electronic component 21 and at least some area of the circuit substrate 14 on which the semiconductor chip is disposed are held between the reference potential layer 15 formed on the circuit substrate 14 and the semiconductor chip whose almost all surface or at least the back surface is made of a conductive material, so that a sufficient shielding effect can be attained without using a metallic case or metallic cap.

To improve the shielding effect, a plurality of through holes having reference potentials may be formed around the connecting lands 19 on the circuit substrate 14 for the electronic component 16, or the reference potential layer 15 may be formed on the circuit substrate 14 excepting the area where the electronic component 16 is connected. And, the provision of the above configuration for each circuit block on one circuit substrate can prevent the circuit blocks from interfering one another.

Now, description will be made of the results of a test on a shielding characteristic of a silicon substrate which is generally used as the circuit substrate for the semiconductor chip used in the embodiment shown in FIG. 1. I/O terminals for a high-frequency signal of 50 MHz to 1800 MHz were terminated with a characteristic impedance of 50Ω, and the input terminal was about 20 mm away from the output terminal. The periphery of one end was enclosed with a metallic sheet with one face released, and a silicon substrate having a thickness of 0.45 mm to be measured was disposed on the released part to examine a noise removing effect. As a result, a noise level could be lowered by about 10 dB to 20 dB as compared with the released case. These values are almost the same as compared with the reduction of about 20 dB to 25 dB where the metallic plate is used as a shield depending on a frequency band, suggesting no problem in practical use.

The opening 11 formed in the circuit substrate 14 for housing the electronic component 21 may be a recess. When it is formed in the shape of a recess, wiring can be made between the electronic component 21 and the reference potential layer 15 formed on the circuit substrate 14, and a mounting density can be improved.

The reference potential layer 15 is formed on the outermost surface of the circuit substrate, but may be formed on the inside layer surface of the circuit substrate. But, in view of a shielding property, when it is formed on the inside layer surface, wiring is preferably not made on the outside of the circuit substrate.

The reference potential layer 15 formed on the circuit substrate may be formed not only on the circuit substrate but also in its vicinity, e.g., on the surface of a housing for accommodating the circuit substrate, or the housing itself may be made of metal having the reference potential.

And, the reference potential layer 15 formed on the circuit substrate serves to be a radio wave reflecting layer for reflecting a radiation noise. For instance, an insulating magnetic material such as ferrite can be used as a radio wave absorbing layer to provide a good shielding effect. In this case, it is more effective to use a sintered body when the circuit frequency is up to several hundreds MHz, or in the form of powder or a paste prepared by mixing a resin and powder when the circuit frequency is higher and particularly in a band of GHz from a viewpoint of magnetic permeability. This is because a noise absorbing effect meets the following equation.

$$\mu(\text{magnetic permeability}) \times f \text{ (frequency)} = \text{constant}$$

Description has been made with reference to a semiconductor chip as the electronic component 16 in the above embodiment. But, the electronic component 16 may be any device or a combination of whatever devices without any problem, e.g., passive devices such as resistors and capacitors, or composite components produced by forming a passive device on the periphery of a semiconductor device. But, members forming such devices have a shielding member for reflecting or absorbing radio waves on one surface or the inside layer surface or the material itself of, e.g., a conductive substrate such as silicon or aluminum, or an insulating magnetic substrate such as ferrite, or an insulating substrate such as alumina having a metallic layer or an insulating magnetic substance layer formed on at least one surface or almost the entire surface of the inside layer surface. The electronic component 21 may be any component because it is not required to have a shielding property on its one surface.

Although the connection of the electronic component 16 and the electronic component 21 has not been described in detail, as a method to connect the electronic component 16 to the circuit substrate, for instance, the bumps 18 such as gold are formed on the connecting pads 17, which are formed on the electronic component 16, for connecting with the circuit substrate 14 by plating or ball bumping. And, a connecting member such as a conductive adhesive is used to connect the bumps 18 with their surfaces downward to the connecting lands 19 of the circuit substrate 14. But, the connecting method is not limited to the above, and there are also other methods such as solder connecting with solder bumps and pressure connecting owing to a shrinkage force of a sealing resin. Besides, though a shielding effect is slightly deteriorated, a connecting pad may be disposed on the end face of the electronic component 16 and soldered to the circuit substrate 14. Similarly, the connection of the electronic component 21 to the electronic component 16 is not limited to any particular method.

Figure 2:
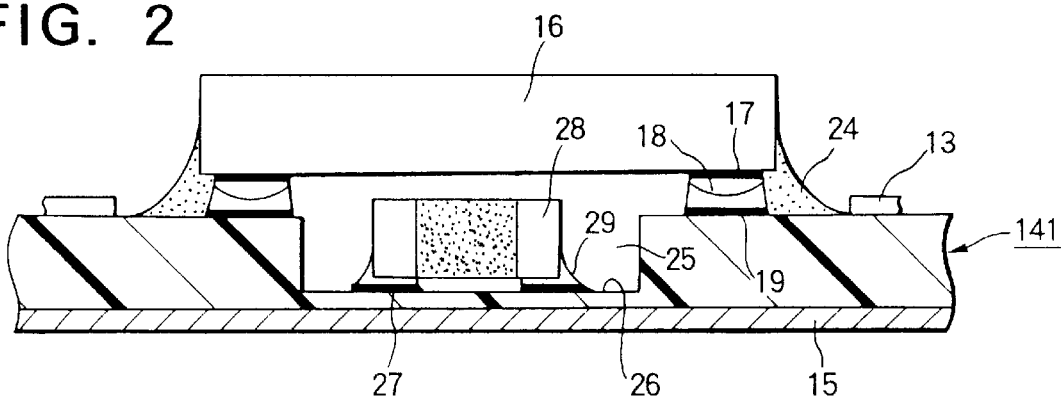
FIG. 2 is a cross section showing the second embodiment of the invention.

FIG. 2 is a cross section showing the second embodiment of the invention. This embodiment shows that the electronic component 21 of the embodiment shown in FIG. 1 is connected to the circuit substrate. Specifically, a recess 25 is formed in a circuit substrate 141, and connecting lands 27 electrically connected to the wiring pattern 13 are fixed to a bottom 26 of the recess 25. An electronic component 28 such as a chip is connected to the connecting lands 27 with solder 29.

In the same way as in the embodiment of FIG. 1, this embodiment can provide the shielding effect for the electronic components 16 and 21 by the shielding property on the side opposed to the connecting pads 17 formed on the electronic component 16 and the reference potential layer 15 which serve instead of the metallic cap.

Figure 3:
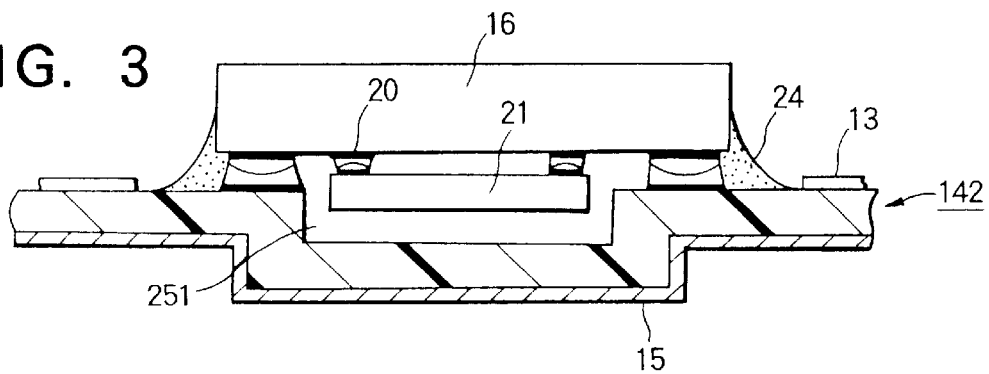
FIG. 3 is a cross section showing the third embodiment of the invention.
Figure 4:
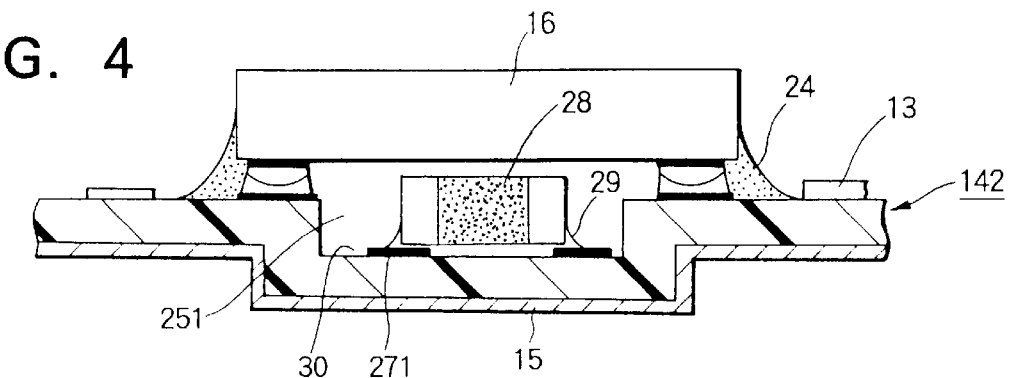
FIG. 4 is a cross section showing the fourth embodiment of the invention.

FIG. 3 and FIG. 4 are cross sections showing the third and fourth embodiments of the invention.

The embodiment of FIG. 3 has the similar structure as the embodiment of FIG. 1 except that the electronic component 21 which is connected to the connecting lands 20 of the electronic component 16 is disposed in a circuit substrate 142 having a recess 251 integrally formed using a flexible substrate such as polyimide. This embodiment has the same effects as the aforementioned embodiment.

The embodiment of FIG. 4 is configured by forming a flexible substrate such as polyimide into the electronic substrate 142 which has the recess 251 integrally formed at a position to oppose the electronic component 16, disposing on a bottom 30 of the recess 251 connecting lands 271 which are electrically connected to the wiring pattern 13, and connecting the electronic component 28 to the connecting lands 271 with the solder 29. This embodiment also has the same effects as the above embodiment.

Thus, since the periphery of the circuit on the circuit substrate which requires to be shielded is provided with the shielding member for reflecting or absorbing radio waves, a special shielding member such as a metallic cap is not required, and a small and lightweight shielding structure can be produced.

Figure 5:
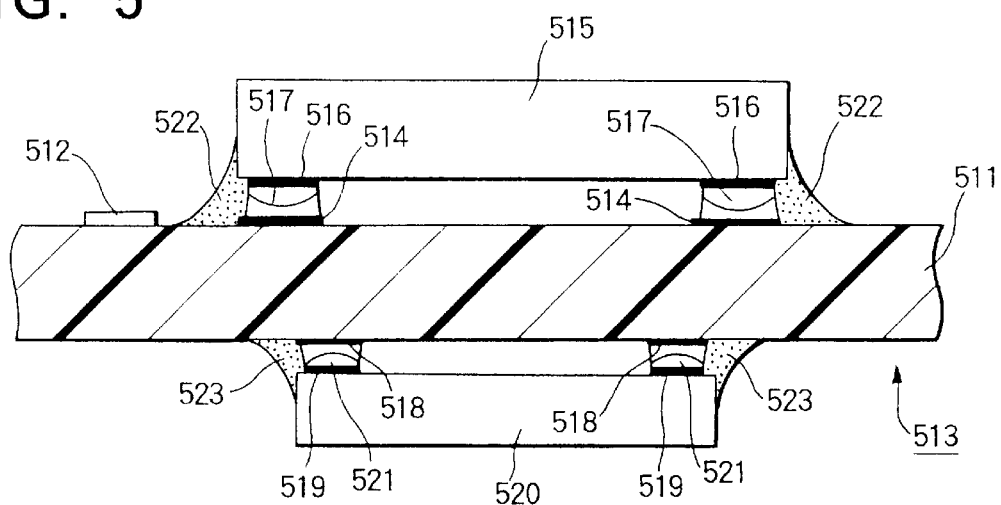
FIG. 5 is a cross section showing the fifth embodiment of the invention.

FIG. 5 is a cross section showing the fifth embodiment of the invention. In this embodiment, a circuit substrate 513 is configured by forming a wiring pattern 512 of copper on an insulating substrate 511 such as alumina or glass epoxy by etching. Connecting pads 516 formed on the surface of an electronic component 515 such as a semiconductor chip are electrically connected with their faces downward to connecting lands 514 which are electrically and integrally connected to the wiring pattern 512 by means of bumps 517 such as gold or solder.

And, to connecting lands 518 formed on the back surface of the circuit substrate 513 whose front surface has the electronic component 515 connected, an electronic component 520 having connecting pads 519 which are used to connect to the circuit substrate 513 on the surface of the same semiconductor chip as the electronic component 515 is electrically connected with the surfaces of the connecting lands 518 downward by means of bumps 521 such as gold or solder, thereby connecting the circuit substrate 513 with the surface of the same semiconductor chip as the electronic component 515.

Then, the connected sections between the electronic component 515 and the circuit substrate 513 and between the electronic component 520 and the circuit substrate 513 are shielded with resins 522, 523 such as epoxy in order to improve a mechanical strength and reliability.

The electronic components 515, 520 which are semiconductor chips provided with the connecting pads 516, 519 use on their other surfaces a conductive substrate such as silicon, and the silicon is grounded through the connecting pads to reflect or absorb radio waves, thereby providing the shielding effect.

When the semiconductor chip uses a non-conductive substrate such as gallium arsenide, the other surface opposite to the surface on which the connecting pads are formed is coated with metal such as gold. And, the electronic component may be any device or a combination of whatever devices, e.g., a passive device such as a resistor or capacitor, or a composite component produced by forming a passive device on the periphery of a semiconductor device. But, members forming such devices have a shielding member for reflecting or absorbing radio waves on one surface or the inside layer surface or the material itself of, e.g., a conductive substrate such as silicon or aluminum, or an insulating magnetic substrate such as ferrite, or an insulating substrate such as alumina having a metallic layer or an insulating magnetic substance layer formed on at least one surface or almost the entire surface of the inside layer surface. With the above connecting structure, the circuit substrate area having the electronic components 515, 520 and at least a semiconductor chip has almost its entire body or at least the entire back surface covered with the semiconductor chip made of a conductive material, thus a sufficient shielding effect can be attained without using a metallic case or metallic cap.

Besides, to improve a shielding effect, a plurality of through holes having reference potentials may be formed around the connecting lands 514, 518 for the electronic components 515, 520 of the circuit substrate 513, or the reference potential layer may be formed on both surfaces of the circuit substrate excepting the areas where the electronic components 515, 520 are disposed. And, the provision of the above configuration for each circuit block on one circuit substrate can prevent the circuit blocks from interfering one another.

A silicon substrate which is generally used for the aforementioned substrate for semiconductor chips was tested for a shielding property. The results will be described. I/O terminals for a high-frequency signal of 50 MHz to 1800 MHz were terminated with a characteristic impedance of 50Ω, and the input terminal was about 20 mm away from the output terminal. The periphery of one end was enclosed with a metallic sheet with one face released, and a silicon substrate having a thickness of 0.45 mm to be measured was disposed on the released part to examine a noise removing effect. As a result, a noise level could be lowered by about 10 dB to 20 dB as compared with the released case. These values do not induce any problem in practical use as compared with the reduction of about 20 dB to 25 dB where the metallic plate was used as a shield. The effect is almost the same as when shielded with the metallic plate depending on a frequency band.

Although the connection of the electronic components 515, 520 has not been described in detail in this embodiment, the bumps 517, 521 such as gold are formed on the connecting pads 516, 519, which are formed on the electronic components 515, 520, for connecting with the circuit substrate 513 by plating or ball bumping, and a connecting member such as a conductive adhesive is used to connect the bumps 517, 521 with their surfaces downward to the connecting lands 514, 518 of the circuit substrate 513.

But, the connecting method is not limited to the above, and there are also other methods such as solder connecting with solder bumps or pressure connecting owing to a shrinkage force of a sealing resin. Besides, though a shielding effect is slightly deteriorated, connecting pads may be disposed on the edges of the faces of the electronic components 515, 520 and soldered to the circuit substrate 513.

Figure 6:
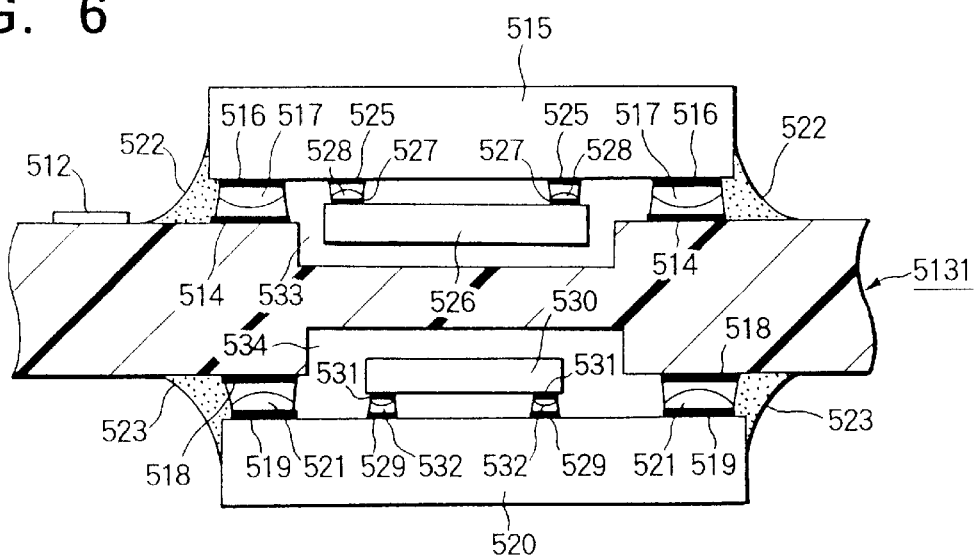
FIG. 6 is a cross section showing the sixth embodiment of the invention.

FIG. 6 is a cross section showing the sixth embodiment of the invention. This embodiment is different from the one shown in FIG. 5 on the points that in addition to the electronic components 515, 520, a third electronic component is respectively connected electrically to the electronic components 515, 520, and recesses are formed in the circuit substrate to receive the third electronic component. The same components as those in FIG. 5 are given the same reference numerals for description.

Specifically, connecting lands 525 electrically connected to the connecting pads 516 are formed on the inside surface of the electronic component 515 on which the connecting pads 516 are formed. Connecting pads 527 on an electronic component 526 which is smaller than the electronic component 515 are electrically connected to the connecting lands 525 via a bump 528 to make a composite component. Similarly, connecting lands 529 electrically connected to the connecting pads 519 are formed on the inside surface of the electronic component 520 on which the connecting pads 519 are formed. Connecting pads 531 on an electronic component 530 which is smaller than the electronic component 520 is electrically connected to the connecting lands 529 via a bump 532 to make a composite component.

A circuit substrate 5131 opposed to the electronic component 526 has a recess 533 formed to receive the electronic component 526. And, the circuit substrate 5131 opposed to the electronic component 530 has another recess 534 formed to receive the electronic component 530.

In addition to the effects provided by the embodiment shown in FIG. 5, this embodiment can shield the electronic components 526, 530 which are the third electronic components. The electronic components 526, 530 are housed in the recesses 533, 534 which are formed in the circuit substrate 5131, thus preventing the thickness of the circuit substrate 5131 from being made thick.

Figure 7:
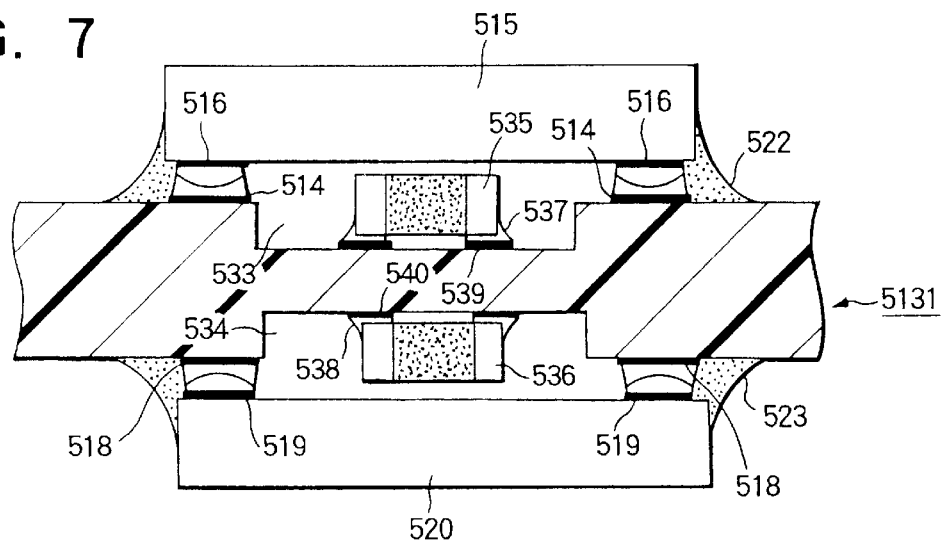
FIG. 7 is a cross section showing the seventh embodiment of the invention.

FIG. 7 is a cross section showing the seventh embodiment of the invention. This embodiment connects third electronic components 535, 536 onto the circuit substrate 5131. The circuit substrate 5131 has the recesses 533, 534 formed at the positions where the electronic components 515, 520 are disposed. The electronic components 535, 536 are respectively placed in the recesses 533, 534 and electrically connected to connecting lands 539, 540 which are electrically connected to the connecting lands 514, 518 with solder 537, 538.

Figure 8:
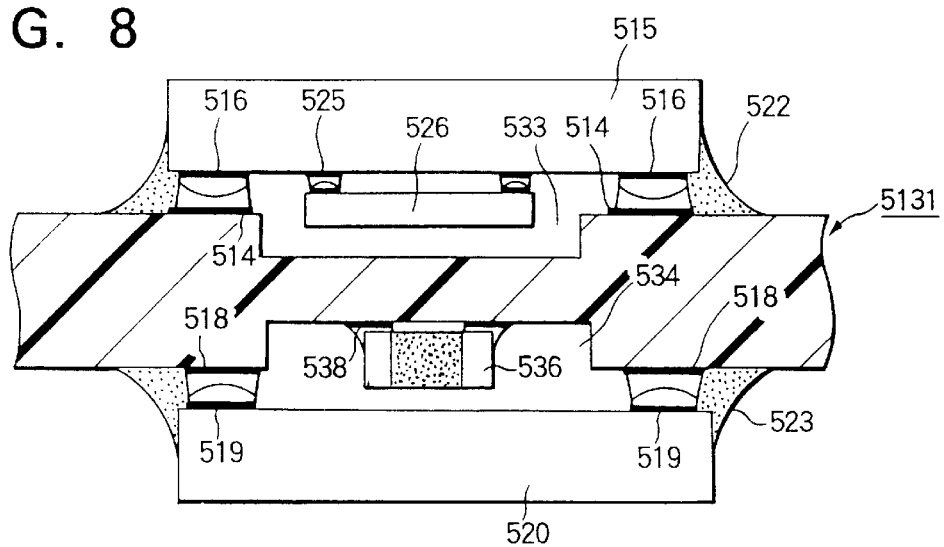
FIG. 8 is a cross section showing the eighth embodiment of the invention.

FIG. 8 is a cross section showing the eighth embodiment of the invention. This embodiment is a combination of the embodiments of FIG. 6 and FIG. 7. The electronic component 526 is connected to the connecting lands 525 formed on the electronic component 515, and the electronic component 536 is connected to thie connecting lands 538 formed in the recess 534 of the circuit substrate 5131.

The embodiments of FIG. 7 and FIG. 8 provide the same effects as the embodiment of FIG. 6. Specifically, a large number of electronic components can be shielded without increasing the area nor thickness of the circuit substrate 5131.

Figure 9:
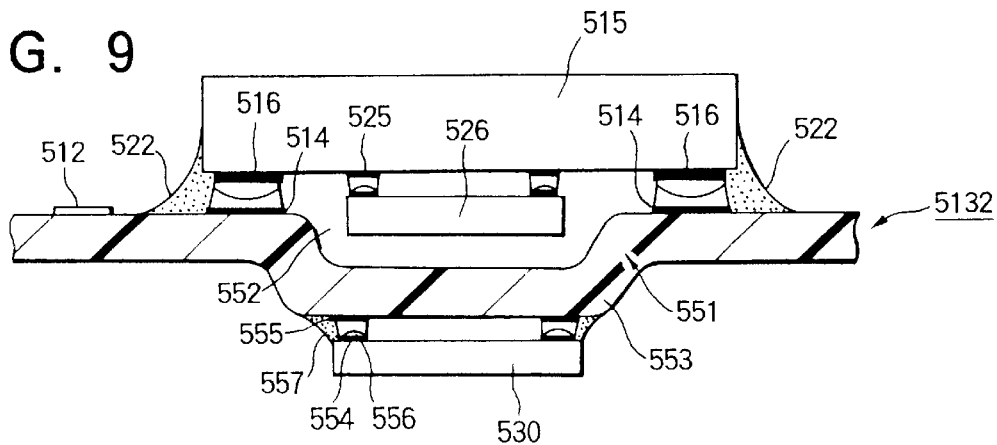
FIG. 9 is a cross section showing the ninth embodiment of the invention.

FIG. 9 is a cross section showing the ninth embodiment of the invention. This embodiment forms a bulged section 551 at a part of a circuit substrate 5132 which is made of a flexible substrate such as polyimide, thereby forming a concave 552 and a convex 553. And, the electronic component 526 is connected to the connecting lands 525 which are formed on the inside surface of the electronic component 515 connected to the connecting lands 514 of the circuit substrate 5132. The electronic component 526 is disposed as housed within the concave 552. And, connecting pads 554 on the electronic component 530 are connected to connecting lands 555 formed on the convex 553 by means of a bump 556. The outer periphery of all bumps 556 is sealed with a resin 557 such as epoxy to improve a mechanical strength and reliability.

Figure 10:
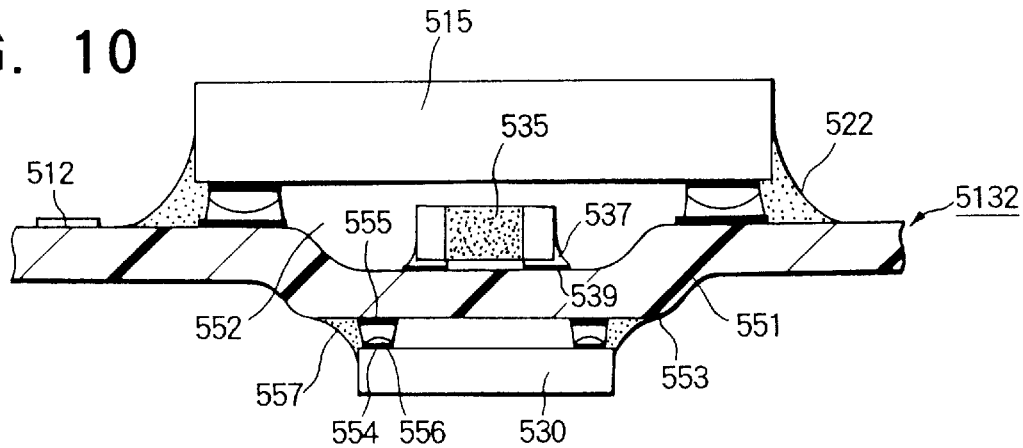
FIG. 10 is a cross section showing the tenth embodiment of the invention.
Figure 11:
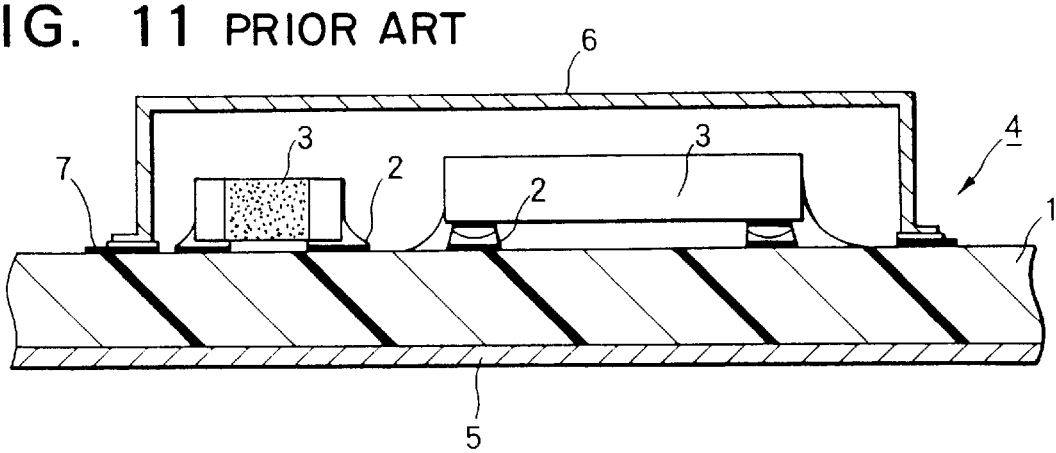
FIG. 11 is a cross section showing a conventional circuit substrate shielding device.
Figure 12:
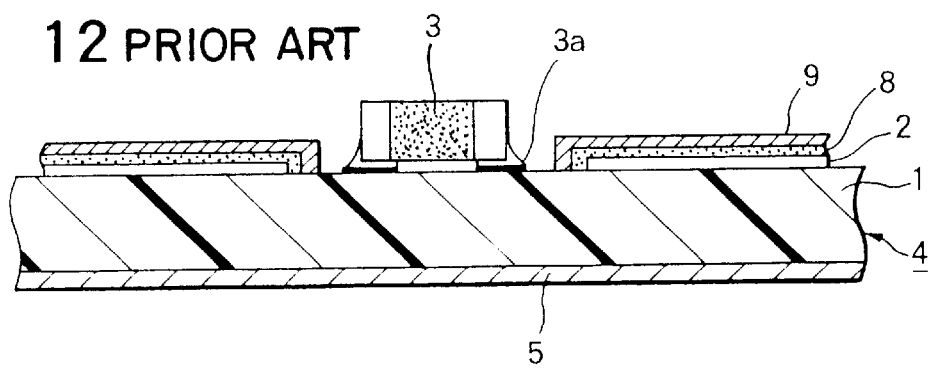
FIG. 12 is a cross section showing another conventional circuit substrate shielding device.

FIG. 9 has shown an example of connecting the electronic component 526 to the electronic component 515. But, as shown in FIG. 10 which is a cross section showing the tenth embodiment of the invention, the electronic component 535 may be connected without any problem to the connecting lands 537 formed on the circuit substrate 5132.

In the fourth and fifth embodiments, the electronic components 515, 530, 526, 535 can also reflect or absorb radio waves by virtue of the conductivity of the surface opposite to the side that the connecting pads are on the electronic components 515, 530 mounted on the circuit substrate 5132. Thus, a small and lightweight circuit substrate shielding structure excelling in shielding effect can be accomplished without using a metallic cap.

What is claimed is:

1. A circuit substrate shielding device comprising:
   a circuit substrate formed by fixing a circuit pattern onto an insulating substrate;
   a first semiconductor device electrically connected to said circuit substrate wherein the first semiconductor device functions as a shielding member for absorbing or reflecting radio waves;
   a metalized shielding layer formed on said circuit substrate to absorb or reflect radio waves: and
   a second semiconductor device disposed between said first semiconductor device and said metalized shielding layer which is formed on said circuit substrate.

2. A circuit substrate shielding device according to claim 1, wherein said second electronic component, disposed between said first electronic component and said shielding layer which is formed on or in the vicinity of said circuit substrate, is electrically connected to said first electronic component.

3. A circuit substrate shielding device according to claim 2, wherein a recess or an opening is formed at a position corresponding to the position of said circuit substrate where said second electronic component is disposed.

4. A circuit substrate shielding device according to claim 1, wherein said second electronic component disposed between said first electronic component and said shielding layer which is formed on or in the vicinity of said circuit substrate is electrically connected to said circuit substrate.

5. A circuit substrate shielding device according to claim 4, wherein said circuit substrate has a recess formed, and said second electronic component is disposed within the recess formed in said circuit substrate and electrically connected.

6. A circuit substrate shielding device according to claim 2, wherein said circuit substrate has a curved part which corresponds to the position where said second electronic component is disposed.

7. A circuit substrate shielding device according to claim 1, wherein said shielding layer formed on said circuit substrate is a magnetic substance layer having an insulating property.

8. A circuit substrate shielding device according to claim 1, wherein said shielding layer formed on said circuit substrate is a metallic layer having a reference potential.

9. A circuit substrate shielding device according to claim 1, wherein said shielding layer formed on said circuit substrate is formed on the other surface or the inside layer surface of the surface where said first electronic component is at least connected.

10. A circuit substrate shielding device according to claim 1, wherein said shielding layer formed in the vicinity of said circuit substrate is formed on the surface or inside of a housing for accommodating said circuit substrate.

11. A circuit substrate shielding device according to claim 1, wherein said first electronic component is an active device or a composite component consisting of active devices.

12. A circuit substrate shielding device according to claim 1, wherein said first electronic component is a passive device or a composite component consisting of passive devices.

13. A circuit substrate shielding device according to claim 1, wherein said first electronic component is a composite component consisting of an active device and a passive device.

14. A circuit substrate shielding device according to claim 1, wherein said semiconductor material has electrical conductivity.

15. A circuit substrate shielding device according to claim 14, wherein said semiconductor material having electrical conductivity is silicon.

16. A circuit substrate shielding device according to claim 1, wherein said first electronic component is made of a semiconductor material having an insulating property and has on its back surface a metallic layer having a reference potential.

17. A circuit substrate shielding device according to claim 16, wherein said semiconductor material having an insulating property is gallium arsenide.

18. A circuit substrate shielding device according to claim 1, wherein said magnetic material has an insulating property.

19. A circuit substrate shielding device according to claim 18, wherein said magnetic material having an insulating property is ferrite.

20. A circuit substrate shielding device comprising:
a circuit substrate formed by fixing a circuit pattern onto an insulating substrate,
a first semiconductor device electrically connected to said circuit substrate wherein the first semiconductor device functions as a shielding member for absorbing or reflecting radio waves and further wherein said first semiconductor device has at least one surface or an inside layer surface comprising an insulating member which is covered with a metalized shielding layer for absorbing or reflecting radio waves;
a metalized shielding layer formed on said circuit substrate to absorb or reflect radio waves; and
a second semiconductor device disposed between said first semiconductor device and said metalized shielding layer which is formed on said circuit substrate.

21. A circuit substrate shielding device according to claim 20, wherein said shielding layer formed on said insulating circuit substrate is a magnetic substance layer having an insulating property.

22. A circuit substrate shielding device according to claim 20, wherein said shielding layer formed on said insulating circuit substrate is a metallic layer having a reference potential.

23. A circuit substrate shielding device comprising:
a circuit substrate formed by fixing a circuit pattern onto an insulating substrate;
a first semiconductor device electrically connected to said circuit substrate wherein the first semiconductor device functions as a shielding member for absorbing or reflecting radio waves; and
a second semiconductor device which is electrically connected to a surface of the circuit substrate opposed to the surface on the other side of the circuit substrate to which said first semiconductor device is connected and which has a shielding member for absorbing or reflecting radio waves.

24. A circuit substrate shielding device according to claim 23, wherein at least a single third electronic component is disposed between said first electronic component and said second electronic component.

25. A circuit substrate shielding device according to claim 24, wherein said third electronic component disposed between said first electronic component and said second electronic component is electrically connected to said first electronic component.

26. A circuit substrate shielding device according to claim 24, wherein said third electronic component disposed between said first electronic component and said second electronic component is electrically connected to said second electronic component.

27. A circuit substrate shielding device according to claim 24, wherein a plurality of third electronic components are disposed between said first electronic component and said second electronic component and electrically connected to said first and second electronic components.

28. A circuit substrate shielding device according to claim 25, 26 or 27, wherein a recess or an opening is formed at a position corresponding to where said third electronic component is disposed on said circuit substrate.

29. A circuit substrate shielding device according to claim 28, wherein a recess is formed in said circuit substrate, and said third electronic component is disposed within said recess formed in said circuit substrate and electrically connected.

30. A circuit substrate shielding device according to claim 24, wherein said circuit substrate is curved at a position corresponding to where said third electronic component is disposed.

31. A circuit substrate shielding device according to claim 23, wherein said first and second electronic components are active devices or composite components made of active devices.

32. A circuit substrate shielding device according to claim 23, wherein said first and second electronic components are passive devices or composite components made of passive devices.

33. A circuit substrate shielding device according to claim 23, wherein said first and second electronic components are composite components made of an active device and a passive device.

34. A circuit substrate shielding device according to claim 23, wherein said first and second electronic components are made of a semiconductor material having electrical conductivity.

35. A circuit substrate shielding device according to claim 34, wherein said semiconductor material having electrical conductivity is silicon.

36. A circuit substrate shielding device according to claim 23, wherein said first and second electronic components are made of a semiconductor material having an insulating property.

37. A circuit substrate shielding device according to claim 36, wherein said semiconductor material having the insulating property is gallium arsenide.

38. A circuit substrate shielding device according to claim 23, wherein said first and second electronic components are made of a magnetic material having an insulating property.

39. A circuit substrate shielding device according to claim 38, wherein said magnetic material having the insulating property is ferrite.

40. A circuit substrate shielding device according to claim 23, wherein said first and second electronic components have at least one surface or the inside layer surface made of an insulating member which is covered with a shielding layer for absorbing or reflecting radio waves.

41. A circuit substrate shielding device according to claim 40, wherein said shielding layer formed on said insulated circuit substrate is a magnetic substance layer having an insulating property.

42. A circuit substrate shielding device according to claim 40, wherein said shielding layer formed on said insulated circuit substrate is a metallic layer having a reference potential.

43. A circuit substrate shielding device according to claim 23, wherein said first and second electronic components are made of a metallic material having an insulating layer and a wiring layer on its surface.

44. A circuit substrate shielding device comprising:
- a circuit substrate formed by fixing a circuit pattern onto an insulating substrate,
- a first semiconductor device electrically connected to said circuit substrate wherein the first semiconductor device functions as a shielding member for absorbing or reflecting radio waves and further wherein said first semiconductor device comprises material selected from the group consisting of a semiconductor material, a magnetic material and a metallic material:
- a metalized shielding layer formed on said circuit substrate to absorb or reflect radio waves; and
- a second semiconductor device disposed between said first semiconductor device and said metalized shielding layer which is formed on said circuit substrate.

* * * * *

UNITED STATES PATENT AND TRADEMARK OFFICE
CERTIFICATE OF CORRECTION

PATENT NO.  : 5,808,878
DATED       : September 15, 1998
INVENTOR(S) : Yasuhito Saito et al.

It is certified that error appears in the above-indentified patent and that said Letters Patent is hereby corrected as shown below:

Claim 1, column 8, line 58, "waves:" should read --waves;--.

Signed and Sealed this

Third Day of August, 1999

Attest:

Q. TODD DICKINSON

*Attesting Officer*   *Acting Commissioner of Patents and Trademarks*